US012532757B2

(12) United States Patent
Yeoh

(10) Patent No.: US 12,532,757 B2
(45) Date of Patent: Jan. 20, 2026

(54) SEMICONDUCTOR PACKAGE

(71) Applicant: Samsung Electronics Co., Ltd., Suwon-si (KR)

(72) Inventor: Hui Min Yeoh, Hwaseong-si (KR)

(73) Assignee: Samsung Electronics Co., Ltd., Suwon-si (KR)

(*) Notice: Subject to any disclaimer, the term of this patent is extended or adjusted under 35 U.S.C. 154(b) by 648 days.

(21) Appl. No.: 17/887,635

(22) Filed: Aug. 15, 2022

(65) Prior Publication Data
US 2023/0139657 A1 May 4, 2023

(30) Foreign Application Priority Data
Nov. 3, 2021 (KR) .................. 10-2021-0149954

(51) Int. Cl.
*H01L 23/498* (2006.01)
*H01L 23/00* (2006.01)
(Continued)

(52) U.S. Cl.
CPC .. *H01L 23/49838* (2013.01); *H01L 23/49816* (2013.01); *H01L 24/08* (2013.01); *H01L 24/09* (2013.01); *H01L 24/16* (2013.01); *H01L 24/17* (2013.01); *H01L 24/32* (2013.01); *H01L 24/73* (2013.01); *H01L 25/0657* (2013.01); *H01L 25/105* (2013.01); *H01L 2224/08235* (2013.01); *H01L 2224/09515* (2013.01); *H01L 2224/16148* (2013.01); *H01L 2224/16227* (2013.01); *H01L 2224/16238* (2013.01);
(Continued)

(58) Field of Classification Search
CPC .................. H01L 23/49838; H01L 23/49816
See application file for complete search history.

(56) References Cited

U.S. PATENT DOCUMENTS

| 6,433,441 B1 | 8/2002 | Niwa et al. |
| 7,002,242 B2 | 2/2006 | Song |
(Continued)

FOREIGN PATENT DOCUMENTS

| JP | 2001-024084 A | 1/2001 |
| JP | 2006-278805 A | 10/2006 |
(Continued)

OTHER PUBLICATIONS

Office Action in Korean Appln. No. 10-2021-0149954, mailed on Aug. 20, 2025, 23 pages (with English translation).

*Primary Examiner* — Matthew L Reames
(74) *Attorney, Agent, or Firm* — Fish & Richardson P.C.

(57) ABSTRACT

A semiconductor package includes a semiconductor chip including a semiconductor substrate having an active layer, ground chip pads on the semiconductor substrate, and signal chip pads on the semiconductor substrate and a package substrate supporting the semiconductor chip, the package substrate including a substrate insulating layer, a plurality of signal line patterns extending in the substrate insulating layer and electrically connected to the signal chip pads, and a plurality of ground line patterns extending in the substrate insulating layer at a same level as a level of the plurality of signal line patterns and electrically connected to the ground chip pads. At least one of the plurality of ground line patterns extends between the plurality of signal line patterns.

19 Claims, 17 Drawing Sheets

(51) Int. Cl.
*H01L 25/065* (2023.01)
*H01L 25/10* (2006.01)

(52) U.S. Cl.
CPC ............... *H01L 2224/17153* (2013.01); *H01L 2224/17515* (2013.01); *H01L 2224/32145* (2013.01); *H01L 2224/32225* (2013.01); *H01L 2224/73204* (2013.01); *H01L 2225/06513* (2013.01); *H01L 2225/06517* (2013.01); *H01L 2225/06524* (2013.01); *H01L 2225/06527* (2013.01); *H01L 2225/06541* (2013.01); *H01L 2225/1023* (2013.01); *H01L 2225/1041* (2013.01); *H01L 2225/1058* (2013.01); *H01L 2924/1431* (2013.01); *H01L 2924/1434* (2013.01); *H01L 2924/182* (2013.01)

(56) References Cited

U.S. PATENT DOCUMENTS

| | | | |
|---|---|---|---|
| 7,391,113 | B2 | 6/2008 | Isa et al. |
| 8,922,053 | B2 | 12/2014 | Takeda et al. |
| 9,263,361 | B2 | 2/2016 | Pagaila et al. |
| 9,728,424 | B2 | 8/2017 | Kim et al. |
| 9,780,057 | B2 | 10/2017 | Pendse |
| 10,629,731 | B2 | 4/2020 | Waidhas et al. |
| 10,971,452 | B2 | 4/2021 | Sung |
| 11,462,462 | B2 | 10/2022 | Yoo et al. |
| 2015/0228602 | A1* | 8/2015 | Sato ........................ H01L 24/06 257/773 |
| 2019/0096798 | A1* | 3/2019 | Aleksov .............. H01L 23/5225 |

FOREIGN PATENT DOCUMENTS

| | | |
|---|---|---|
| JP | 2016-106427 A | 6/2016 |
| KR | 100382088 B1 | 5/2003 |
| KR | 100408391 B1 | 12/2003 |
| KR | 10-2016-0006035 A | 1/2016 |
| KR | 10-2021-0011276 A | 2/2021 |
| KR | 2021-0029422 A | 3/2021 |

\* cited by examiner

SEMICONDUCTOR PACKAGE

CROSS-REFERENCE TO RELATED APPLICATION

This application is based on and claims priority under 35 U.S.C. § 119 to Korean Patent Application No. 10-2021-0149954, filed on Nov. 3, 2021, in the Korean Intellectual Property Office, the disclosure of which is incorporated by reference herein in its entirety.

BACKGROUND

The inventive concepts relate to a semiconductor package.

As the storage capacity of a semiconductor chip increases, a semiconductor package including the semiconductor chip is required to be thin and light. In addition, research into including semiconductor chips of various functions in the semiconductor package and to rapidly drive the semiconductor chips tends to be performed. In response to such a trend, research into reducing a size of the semiconductor package and to improve operation performance of the semiconductor package is being actively performed.

SUMMARY

The inventive concepts relate to a semiconductor package with improved signal integrity (SI).

According to some example embodiments of the inventive concepts, there is provided a semiconductor package including a semiconductor chip including a semiconductor substrate having an active layer, ground chip pads on the semiconductor substrate, and signal chip pads on the semiconductor substrate and a package substrate supporting the semiconductor chip, the package substrate including a substrate insulating layer, a plurality of signal line patterns extending in the substrate insulating layer and electrically connected to the signal chip pads, and a plurality of ground line patterns extending in the substrate insulating layer at a same level as a level of the plurality of signal line patterns and electrically connected to the ground chip pads. At least one of the plurality of ground line patterns extends between the plurality of signal line patterns.

According to some example embodiments of the inventive concepts, there is provided a semiconductor package including a first semiconductor chip including a first semiconductor substrate having a first active layer, first lower ground chip pads under the first semiconductor substrate, first lower signal chip pads under the first semiconductor substrate, ground through electrodes passing through at least a part of the first semiconductor substrate in a vertical direction and electrically connected to the first lower ground chip pads, signal through electrodes passing through at least a part of the first semiconductor substrate in a vertical direction and electrically connected to the first lower signal chip pads, first upper ground chip pads on the first semiconductor substrate and electrically connected to the ground through electrodes, and first upper signal chip pads on the first semiconductor substrate and electrically connected to the signal through electrodes, a second semiconductor chip on the first semiconductor chip, the second semiconductor chip including a second semiconductor substrate having a second active layer, second lower ground chip pads under the second semiconductor substrate, and second lower signal chip pads under the second semiconductor substrate, ground chip connection terminals between the first upper ground chip pads and the second lower ground chip pads, signal chip connection terminals between the first upper signal chip pads and the second lower signal chip pads, and a package substrate supporting the first semiconductor chip, the package substrate including a substrate insulating layer, a plurality of signal line patterns extending in the substrate insulating layer and electrically connected to the first lower signal chip pads, and a plurality of ground line patterns extending in the substrate insulating layer at a same level as a level of the plurality of signal line patterns and electrically connected to the first lower ground chip pads. At least one of the plurality of ground line patterns extends between the plurality of signal line patterns.

According to some example embodiments of the inventive concepts, there is provided a semiconductor package including a lower semiconductor chip including a semiconductor substrate having an active layer, ground chip pads on the semiconductor substrate, and signal chip pads on the semiconductor substrate, a lower package substrate supporting the lower semiconductor chip, the lower package substrate including a substrate insulating layer, a plurality of signal line patterns extending in the substrate insulating layer and electrically connected to the signal chip pads, and a plurality of ground line patterns extending in the substrate insulating layer at a same level as a level of the plurality of signal line patterns and electrically connected to the ground chip pads, conductive posts outside the lower semiconductor chip and electrically connected to the signal line patterns, a lower molding layer surrounding the lower semiconductor chip and the conductive posts on the lower package substrate, and an upper redistribution structure on the lower molding layer, the upper redistribution structure including an upper redistribution insulating layer on the lower molding layer, and upper redistribution line patterns extending in the upper redistribution insulating layer and electrically connected to the conductive posts. At least one of the plurality of ground line patterns extends between the plurality of signal line patterns.

The plurality of ground line patterns and the plurality of signal line patterns of the package substrate included in the semiconductor package according to an embodiment of the inventive concepts may be substantially at the same level and some of the plurality of ground line patterns may extend among the plurality of signal line patterns. Therefore, signal interference among the plurality of signal line patterns may be suppressed so that signal integrity (SI) of the semiconductor package may be improved.

BRIEF DESCRIPTION OF THE DRAWINGS

Some example embodiments of the inventive concepts will be more clearly understood from the following detailed description taken in conjunction with the accompanying drawings in which.

DETAILED DESCRIPTION

Hereinafter, some example embodiments of the inventive concepts will be described in detail with reference to the accompanying drawings.

It will be understood that elements and/or properties thereof may be recited herein as being "the same" or "equal" as other elements, and it will be further understood that elements and/or properties thereof recited herein as being "identical" to, "the same" as, or "equal" to other elements may be "identical" to, "the same" as, or "equal" to or "substantially identical" to, "substantially the same" as or "substantially equal" to the other elements and/or properties thereof. Elements and/or properties thereof that are "substantially identical" to, "substantially the same" as or "substantially equal" to other elements and/or properties thereof will be understood to include elements and/or properties thereof that are identical to, the same as, or equal to the other elements and/or properties thereof within manufacturing tolerances and/or material tolerances. Elements and/or properties thereof that are identical or substantially identical to and/or the same or substantially the same as other elements and/or properties thereof may be structurally the same or substantially the same, functionally the same or substantially the same, and/or compositionally the same or substantially the same.

It will be understood that elements and/or properties thereof described herein as being "substantially" the same and/or identical encompasses elements and/or properties thereof that have a relative difference in magnitude that is equal to or less than 10%. Further, regardless of whether elements and/or properties thereof are modified as "substantially," it will be understood that these elements and/or properties thereof should be construed as including a manufacturing or operational tolerance (e.g., ±10%) around the stated elements and/or properties thereof.

When the terms "about" or "substantially" are used in this specification in connection with a numerical value, it is intended that the associated numerical value include a tolerance of ±10% around the stated numerical value. When ranges are specified, the range includes all values therebetween such as increments of 0.1%. Further, regardless of whether numerical values or shapes are modified as "about" or "substantially," it will be understood that these values and shapes should be construed as including a manufacturing or operational tolerance (e.g., ±10%) around the stated numerical values or shapes.

When an element is referred to as being "connected to" or "electrically connected to" another element, the element may be directly connected to the other element, or one or more other intervening elements may be present. For example, an element described as being "connected to" another element may be "electrically connected to" the other element. In contrast, when an element is referred to as being "directly connected to" another element there are no intervening elements present.

Figure 1:
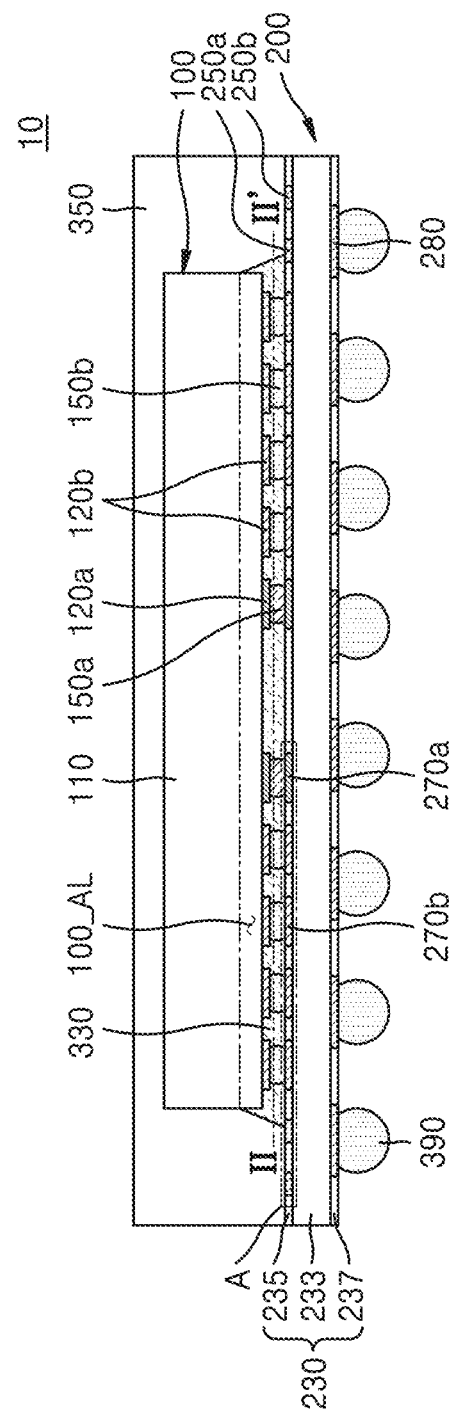
FIG. 1 is a cross-sectional view of a semiconductor package according to some example embodiments of the inventive concepts.
Figure 2:
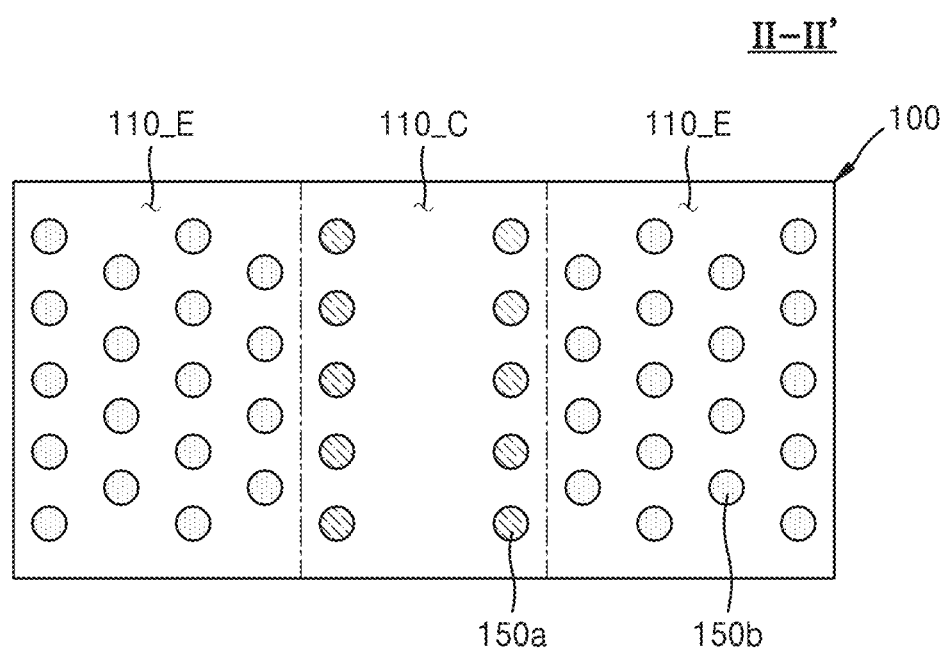
FIG. 2 is a cross-sectional view taken along the line II-II' of FIG. 1.

FIG. 1 is a cross-sectional view of a semiconductor package 10 according to some example embodiments of the inventive concepts. FIG. 2 is a cross-sectional view taken along the line II-II' of FIG. 1.

Referring to FIGS. 1 and 2, the semiconductor package 10 according to some example embodiments of the inventive concepts may include a semiconductor chip 100, ground chip connection terminals 150$a$, signal chip connection terminals 150$b$, a package substrate 200, an underfill layer 330, a molding layer 350, and/or external connection terminals 390.

The semiconductor chip 100 may include a semiconductor substrate 110 having an active layer 100_AL, ground chip pads 120$a$ arranged on a bottom surface of the semiconductor substrate 110, and/or signal chip pads 120$b$ arranged on the bottom surface of the semiconductor substrate 110.

In some example embodiments, the semiconductor chip 100 may include a memory semiconductor chip. For example, the memory semiconductor chip may include a volatile memory semiconductor chip such as dynamic random access memory (DRAM) and/or static random access memory (SRAM) and/or a non-volatile memory semiconductor chip such as phase-change random access memory (PRAM), magneto-resistive random access memory (MRAM), ferroelectric random access memory (FeRAM), and/or resistive random access memory (RRAM).

However, the inventive concepts are not limited thereto, and the semiconductor chip 100 may include a logic semiconductor chip. For example, the logic semiconductor chip may include a central processing unit (CPU), a micro-processing unit (MPU), a graphics processing unit (GPU), and/or an application processor (AP).

The semiconductor substrate 110 of the semiconductor chip 100 may include silicon (Si). In addition, the semiconductor substrate 110 may include a semiconductor element such as germanium (Ge) and/or a compound semiconductor such as silicon carbide (SiC), gallium arsenide (GaAs), indium arsenide (InAs), and/or indium phosphide (InP). However, the material of the semiconductor substrate 110 is not limited thereto.

In some example embodiments, the semiconductor substrate 110 may include the active layer 100_AL in a lower portion thereof. The active layer 100_AL may include a plurality of various kinds of individual devices. For example, the plurality of individual devices may include various micro-electronic devices, for example, an image sensor such as a complementary metal-oxide semiconductor (CMOS) transistor, a metal-oxide-semiconductor field effect transistor (MOSFET), system large scale integration (LSI), and/or a CMOS imaging sensor (CIS), a micro-electro-mechanical system (MEMS), an active element, and/or a passive element.

Hereinafter, a horizontal direction may be defined as a direction parallel with a direction in which a top surface and the bottom surface of the semiconductor substrate 110 extend and a vertical direction may be defined as a direction perpendicular to the direction in which the top surface and the bottom surface of the semiconductor substrate 110 extend.

The ground chip pads 120a of the semiconductor chip 100 may be provided for grounding of the semiconductor chip 100 and may be arranged on the bottom surface of the semiconductor substrate 110. In addition, the signal chip pads 120b of the semiconductor chip 100 may be provided for transmitting a command signal and/or an address signal of the semiconductor chip 100 and/or a data signal and may be arranged on the bottom surface of the semiconductor substrate 110.

In some example embodiments, the ground chip pads 120a and/or the signal chip pads 120b may include copper (Cu). However, the inventive concepts are not limited thereto, and the ground chip pads 120a and/or the signal chip pads 120b may include a metal such as nickel (Ni), gold (Au), silver (Ag), aluminum (Al), tungsten (W), titanium (Ti), tantalum (Ta), indium (In), molybdenum (Mo), manganese (Mn), cobalt (Co), tin (Sn), magnesium (Mg), rhenium (Re), beryllium (Be), gallium (Ga), and/or ruthenium (Ru) and/or an alloy of the above metals.

In some example embodiments, the ground chip pads 120a may be arranged in the center 110_C of the semiconductor substrate 110 and the signal chip pads 120b may be arranged at edges 110_E in the outside of the center 110_C of the semiconductor substrate 110. That is, the ground chip pads 120a may be closer to the center of the semiconductor substrate 110 than the signal chip pads 120b.

In some example embodiments, the ground chip pads 120a may be connected to the ground chip connection terminals 150a, ground substrate pads 270a, and/or ground line patterns 250a to be described later. In addition, the signal chip pads 120b may be connected to signal chip connection terminals 150b, signal substrate pads 270b, and/or signal line patterns 250b to be described later.

The package substrate 200 may support the semiconductor chip 100. In addition, the package substrate 200 may include a substrate insulating layer 230, the ground line patterns 250a, the signal line patterns 250b, the ground substrate pads 270a, the signal substrate pads 270b, and/or external connection pads 280.

In some example embodiments, the package substrate 200 may be a printed circuit board (PCB). However, the package substrate 200 may include various kinds of substrates such as a ceramic substrate without being limited to a structure and/or a material of the PCB.

The substrate insulating layer 230 may include a base board layer 233, a top solder resist layer 235, and/or a bottom solder resist layer 237. The base board layer 233 may include at least one selected from phenolic resin, epoxy resin, and/or polyimide (PI). For example, the base board layer 233 may include at least one selected from flame retardant 4 (FR4), tetrafunctional epoxy, polyphenylene ether, epoxy/polyphenylene oxide, bismaleimide triazine (BT), thermount, cyanate ester, PI, and/or liquid crystal polymer.

In some example embodiments, the base board layer 233 may include polyester, polyester terephthalate, fluorinated ethylene propylene (FEP), resin-coated paper, liquid PI resin, and/or a polyethylene naphthalate (PEN) film. In addition, the base board layer 233 may be formed by laminating a plurality of base layers.

In some example embodiments, the top solder resist layer 235 may be arranged on the base board layer 233 to cover the ground line patterns 250a and/or the signal line patterns 250b and to expose at least parts of the ground substrate pads 270a and/or the signal substrate pads 270b.

In some example embodiments, the bottom solder resist layer 237 may be arranged on the base board layer 233 to expose at least parts of the external connection pads 280. Although not shown in FIG. 1, the ground line patterns 250a and/or the signal line patterns 250b may be electrically connected to the external connection pads 280 through a conductive through via (not shown) passing through the base board layer 233 in the vertical direction.

In some example embodiments, the top solder resist layer 235 and/or the bottom solder resist layer 237 may include a PI film, a polyester film, a flexible solder mask, photoimageable coverlay (PIC), and/or photoimageable solder resist.

For example, the top solder resist layer 235 and/or the bottom solder resist layer 237 may be formed by thermosetting ink coated by a silk screen printing method or an inkjet method. In addition, the top solder resist layer 235 and/or the bottom solder resist layer 237 may be formed by removing a part of photosensitive solder resist coated by a screen method or a spray coating method by exposure and development and performing thermosetting.

The ground line patterns 250a may extend in the substrate insulating layer 230 in the horizontal direction and may be connected to the ground substrate pads 270a. Specifically, the ground line patterns 250a may extend on the base board layer 233 in the vertical direction and may be covered with the top solder resist layer 235.

The signal line patterns 250b may extend in the substrate insulating layer 230 in the horizontal direction and may be connected to the signal substrate pads 270b. Specifically, the signal line patterns 250b may extend on the base board layer 233 in the horizontal direction and may be covered with the top solder resist layer 235.

In some example embodiments, the ground line patterns 250a and/or the signal line patterns 250b may include Cu. For example, the ground line patterns 250a and/or the signal line patterns 250b may include at least one of electrolytically deposited (ED) Cu, rolled-annealed (RA) Cu foil, stainless steel foil, Al foil, ultra-thin Cu foils, sputtered Cu, Cu alloys, Ni, stainless steel, and/or beryllium Cu.

In some example embodiments, the ground line patterns 250a and the signal line patterns 250b may be substantially at the same level in the substrate insulating layer 230. That is, a height of each or one or more of the ground line patterns 250a from a bottom surface of the package substrate 200 in the vertical direction may be substantially equal to a height of each or one or more of the signal line patterns 250b from the bottom surface of the package substrate 200 in the vertical direction.

In some example embodiments, a length (that is, a thickness) of each or one or more of the ground line patterns 250a and/or the signal line patterns 250b in the vertical direction may be about 3 micrometers to about 30 micrometers. For example, the length of each or one or more of the ground line patterns 250a and/or the signal line patterns 250b in the vertical direction may be about 5 micrometers. However, the length of each or one or more of the ground line patterns 250a and/or the signal line patterns 250b in the vertical direction is not limited thereto.

In some example embodiments, at least one of the ground line patterns 250a may extend between two adjacent signal line patterns 250b. Therefore, signal interference between the two adjacent signal line patterns 250b may be suppressed so that signal integrity (SI) of the semiconductor package 10 may be improved.

The arrangement of the ground line patterns 250a and the signal line patterns 250b will be described later in more detail with reference to FIGS. 3 to 5.

The ground substrate pads 270a may be arranged on the base board layer 233 to be respectively connected to the ground line patterns 250a. In addition, at least parts of the ground substrate pads 270a may be exposed by the top solder resist layer 235 and the exposed ground substrate pads 270a may contact the ground chip connection terminals 150a.

In some example embodiments, the ground substrate pads 270a may be substantially at the same level as that of the ground line patterns 250a. However, the inventive concepts are not limited thereto, and the ground substrate pads 270a may be at a higher level than that of the ground line patterns 250a.

The signal substrate pads 270b may be arranged on the base board layer 233 to be connected to the signal line patterns 250b. In addition, at least parts of the signal substrate pads 270b may be exposed by the top solder resist layer 235 and the exposed signal substrate pads 270b may contact the signal chip connection terminals 150b.

In some example embodiments, the signal substrate pads 270b may be substantially at the same level as that of the signal line patterns 250b. However, the inventive concepts are not limited thereto, and the signal substrate pads 270b may be at a higher level than that of the signal line patterns 250b.

In addition, the ground substrate pads 270a and/or the signal substrate pads 270b may be arranged in zigzags or honeycombs.

In addition, the ground substrate pads 270a may be arranged in the center of the package substrate 200 and the signal substrate pads 270b may be arranged at edges of the package substrate 200.

In some example embodiments, the ground substrate pads 270a may overlap the ground chip pads 120a of the semiconductor chip 100 in the vertical direction and/or the signal substrate pads 270b may overlap the signal chip pads 120b of the semiconductor chip 100 in the vertical direction.

The arrangement of the ground substrate pads 270a and the signal substrate pads 270b will be described later in more detail with reference to FIGS. 3 to 5.

The external connection pads 280 may be arranged under the base board layer 233 and may be exposed by the bottom solder resist layer 237. In addition, the external connection pads 280 may respectively contact the external connection terminals 390.

In some example embodiments, the external connection pads 280 may be electrically connected to the ground line pattern 250a and/or signal line patterns 250b through a conductive through via (not shown) passing through the base board layer 233 in the vertical direction.

The ground chip connection terminals 150a may be between the ground chip pads 120a of the semiconductor chip 100 and the ground substrate pads 270a of the package substrate 200. For example, the ground chip connection terminals 150a may electrically connect the ground chip pads 120a of the semiconductor chip 100 to the ground line patterns 250a of the package substrate 200.

In addition, the signal chip connection terminals 150b may be between the signal chip pads 120b of the semiconductor chip 100 and the signal substrate pads 270b of the package substrate 200. For example, the signal chip connection terminals 150b may electrically connect the signal chip pads 120b of the semiconductor chip 100 to the signal line patterns 250b of the package substrate 200.

The ground chip connection terminals 150a and/or the signal chip connection terminals 150b may be arranged on the semiconductor substrate 110 in zigzags and/or honeycombs.

In some example embodiments, the ground chip connection terminals 150a may overlap the center 110_C of the semiconductor substrate 110 in the vertical direction and the signal chip connection terminals 150b may overlap the edges 110_E of the semiconductor substrate 110 in vertical direction. For example, the ground chip connection terminals 150a may be arranged inside the signal chip connection terminals 150b. That is, the ground chip connection terminals 150a may be closer to the center of the semiconductor chip 100 than the signal chip connection terminals 150b.

In some example embodiments, the ground chip connection terminals 150a and/or the signal chip connection terminals 150b may be solder balls including at least one of Cu, Al, Ag, Sn, and/or Au.

The underfill layer 330 may be arranged between the semiconductor chip 100 and the package substrate 200 to surround the ground chip connection terminals 150a and/or the signal chip connection terminals 150b. That is, the underfill layer 330 may fix the semiconductor chip 100 onto a top surface of the package substrate 200.

In some example embodiments, the underfill layer 330 may include at least one of insulating polymer and epoxy resin. For example, the underfill layer 330 may include an epoxy molding compound (EMC).

The molding layer 350 may be mounted on the package substrate 200 to surround the semiconductor chip 100. In some example embodiments, the molding layer 350 may include at least one of insulating polymer and/or epoxy resin. For example, the molding layer 350 may include an EMC.

The external connection terminals 390 may be respectively attached to the external connection pads 280 of the package substrate 200. In addition, the external connection terminals 390 may electrically connect the semiconductor chip 100 to an external device.

Figure 3:
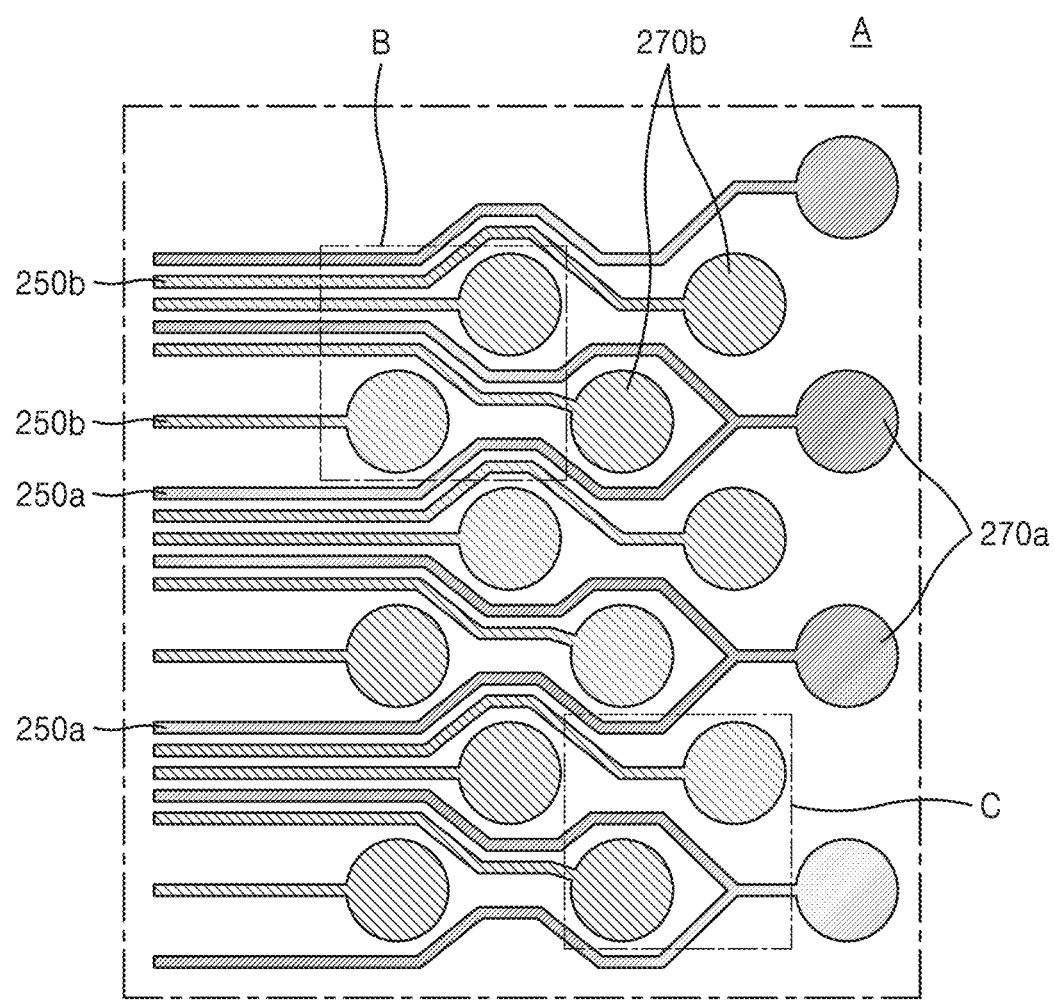
FIG. 3 is a cross-sectional view of a region A' of FIG. 1.

FIG. 3 is a cross-sectional view of a region A of FIG. 1. FIG. 4 is an enlarged view of a region B of FIG. 3 and FIG. 5 is an enlarged view of a region C of FIG. 3.

In addition, the ground substrate pads 270a may be closer to the center of the semiconductor substrate 110 than the signal substrate pads 270b.

In addition, when the semiconductor package 10 is seen from a planar view, the ground substrate pads 270a and/or the signal substrate pads 270b may be arranged in zigzags or honeycombs.

In some example embodiments, the ground line patterns 250a may be electrically and respectively connected to the ground substrate pads 270a and the signal line patterns 250b may be electrically and respectively connected to the signal substrate pads 270b.

In some example embodiments, the ground line patterns 250a may be substantially at the same level as that of the signal line patterns 250b. In addition, at least one of the ground line patterns 250a may extend between two adjacent signal line patterns 250b.

In some example embodiments, some of the ground line patterns 250a may surround sides of the signal line patterns 250b. For example, one signal line pattern 250b may extend between two ground line patterns 250a. In addition, two signal line patterns 250b may extend between two ground line patterns 250a.

Figure 4:
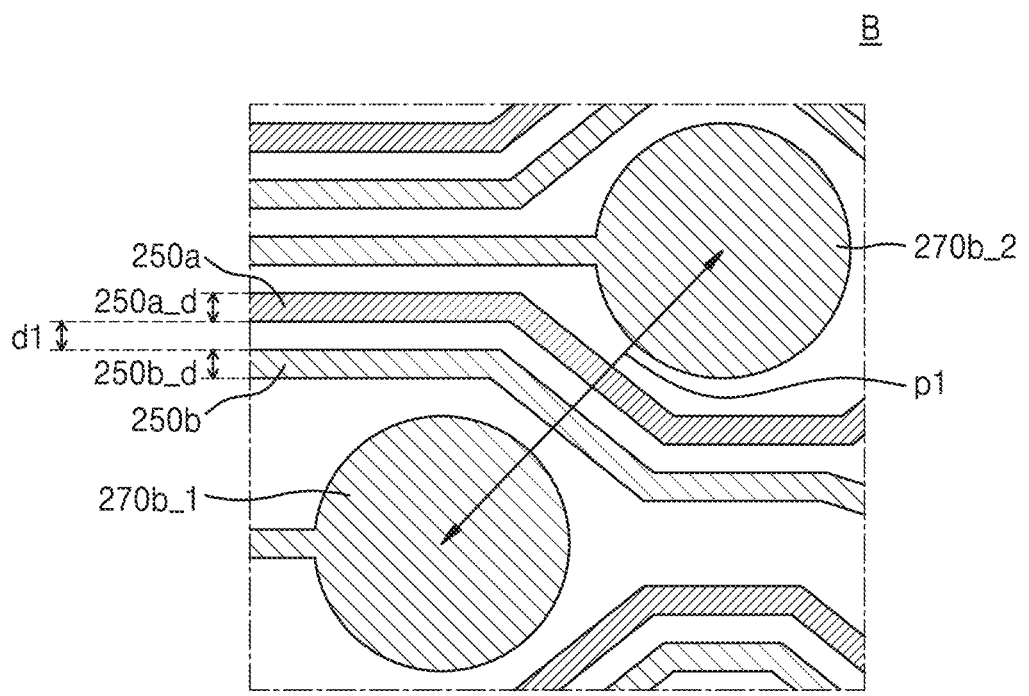
FIG. 4 is an enlarged view of a region B of FIG. 3.

Referring to FIG. 4, when the signal substrate pads 270b are arranged in zigzags, two line patterns may extend between two adjacent signal substrate pads 270b_1 and 270b_2. For example, one ground line pattern 250a and one signal line pattern 250b may extend between two adjacent signal substrate pads 270b_1 and 270b_2.

When one ground line pattern 250a and one signal line pattern 250b extend between two adjacent signal substrate pads 270b_1 and 270b_2, a first pitch p1 between the two adjacent signal substrate pads 270b_1 and 270b_2 may be about 146 micrometers to about 158 micrometers. The first pitch p1 may be defined as a length between the centers of the two adjacent signal substrate pads 270b_1 and 270b_2 in the horizontal direction.

In some example embodiments, a width 250a_d of the ground line pattern 250a and a width 250b_d of the signal line pattern 250b may be about 5 micrometers to about 20 micrometers. For example, the width 250a_d of the ground line pattern 250a and the width 250b_d of the signal line pattern 250b may be about 9 micrometers. However, the width 250a_d of the ground line pattern 250a and the width 250b_d of the signal line pattern 250b are not limited thereto.

In some example embodiments, a distance d1 between the ground line pattern 250a and the signal line pattern 250b in the horizontal direction may be about 10 micrometers to about 100 micrometers. However, the distance d1 between the ground line pattern 250a and the signal line pattern 250b in the horizontal direction is not limited thereto.

Figure 5:
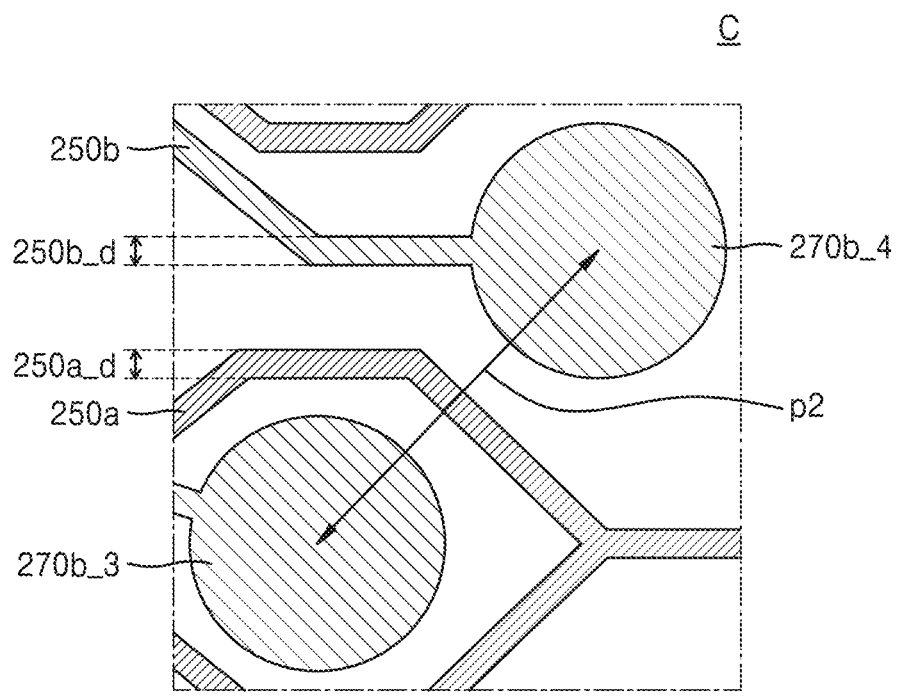
FIG. 5 is an enlarged view of a region C of FIG. 3.

Referring to FIG. 5, when the signal substrate pads 270b are arranged in zigzags, one line pattern may extend between two adjacent signal substrate pads 270b_3 and 270b_4. For example, one ground line pattern 250a may extend between the two adjacent signal substrate pads 270b_3 and 270b_4.

When the one ground line pattern 250a extends between the two adjacent signal substrate pads 270b_3 and 270b_4, a second pitch p2 between the two adjacent signal substrate pads 270b_3 and 270b_4 may be about 125 micrometers to about 148 micrometers. The second pitch p2 may be defined as a length between the centers of the two adjacent signal substrate pads 270b_3 and 270b_4 in the horizontal direction.

In some example embodiments, the second pitch p2 may be less than the first pitch p1 (refer to FIG. 4). Specifically, when the first pitch p1 is about 146 micrometers to about 158 micrometers, the second pitch p2 may be less than the first pitch p1 in a range of about 125 micrometers to about 148 micrometers.

Because the ground line patterns 250a and the signal line patterns 250b of the semiconductor package 10 according to some example embodiments of the inventive concepts may be substantially at the same level and at least one of the ground line patterns 250a may extend among the signal line patterns 250b, signal interference (for example, crosstalk) among the signal line patterns 250b may be reduced or prevented. Therefore, the SI of the semiconductor package 10 according to some example embodiments of the inventive concepts may be improved.

Figure 6:
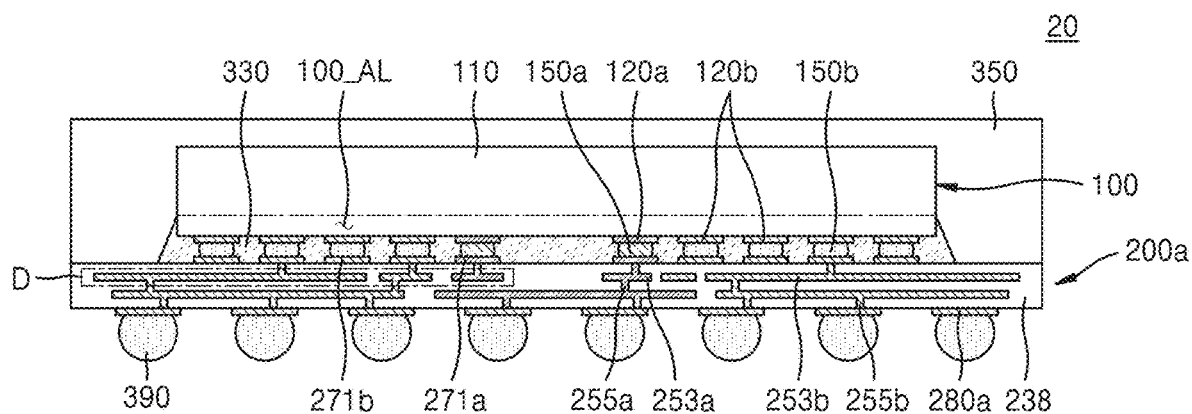
FIG. 6 is a cross-sectional view of a semiconductor package according to some example embodiments of the inventive concepts.

FIG. 6 is a cross-sectional view of a semiconductor package 20 according to some example embodiments of the inventive concepts.

Referring to FIG. 6, the semiconductor package 20 according to some example embodiments of the inventive concepts may include a semiconductor chip 100, ground chip connection terminals 150a, signal chip connection terminals 150b, a package substrate 200a, an underfill layer 330, a molding layer 350, and/or external connection terminals 390.

Hereinafter, description previously given with reference to the semiconductor package 10 of FIG. 1 will not be given with reference to the semiconductor package 20 of FIG. 6 and a difference between the semiconductor package 10 of FIG. 1 and the semiconductor package 20 of FIG. 6 will be mainly described.

The package substrate 200a may include a redistribution insulating layer 238, ground line patterns 253a and/or signal line patterns 253b extending in the redistribution insulating layer 238 in the horizontal direction, ground via patterns 255a and/or signal via patterns 255b extending in the redistribution insulating layer 238 in the vertical direction, ground substrate pads 271a and/or signal substrate pads 271b arranged on the redistribution insulating layer 238, and/or external connection pads 280a arranged under the redistribution insulating layer 238.

The redistribution insulating layer 238 may include oxide and/or nitride. For example, the redistribution insulating layer 238 may include silicon oxide and/or silicon nitride. In addition, the redistribution insulating layer 238 may include photoimageable dielectric (PID) and/or photosensitive polyimide (PSPI).

The ground line patterns 253a may extend in the redistribution insulating layer 238 in the horizontal direction and may be electrically connected to the ground substrate pads 271a. In addition, the signal line patterns 253b may extend in the redistribution insulating layer 238 in the horizontal direction and may be connected to the signal substrate pads 271b.

In addition, the ground via patterns 255a may extend in the redistribution insulating layer 238 in the vertical direction to connect the ground line patterns 253a to the ground substrate pads 271a, to connect the ground line patterns 253a to one another, and/or to connect the ground line patterns 253a to the external connection pads 280a.

In addition, the signal via patterns 255b may extend in the redistribution insulating layer 238 in the vertical direction to connect the signal line patterns 253b to the signal substrate pads 271b, to connect the signal line patterns 253b to one another, and/or to connect the signal line patterns 253b to the external connection pads 280a.

In some example embodiments, the ground line patterns 253a and the signal line patterns 253b may be substantially at the same level in the redistribution insulating layer 238. That is, a height of each or one or more of the ground line patterns 253a from a bottom surface of the package substrate 200a in the vertical direction may be substantially equal to a height of each or one or more of the signal line patterns 253b from the bottom surface of the package substrate 200a in the vertical direction.

In some example embodiments, at least one of the ground line patterns 253a may extend between two adjacent signal line patterns 253b. Therefore, signal interference between the two adjacent signal line patterns 253b may be suppressed so that SI of the semiconductor package 20 may be improved.

Figure 7:
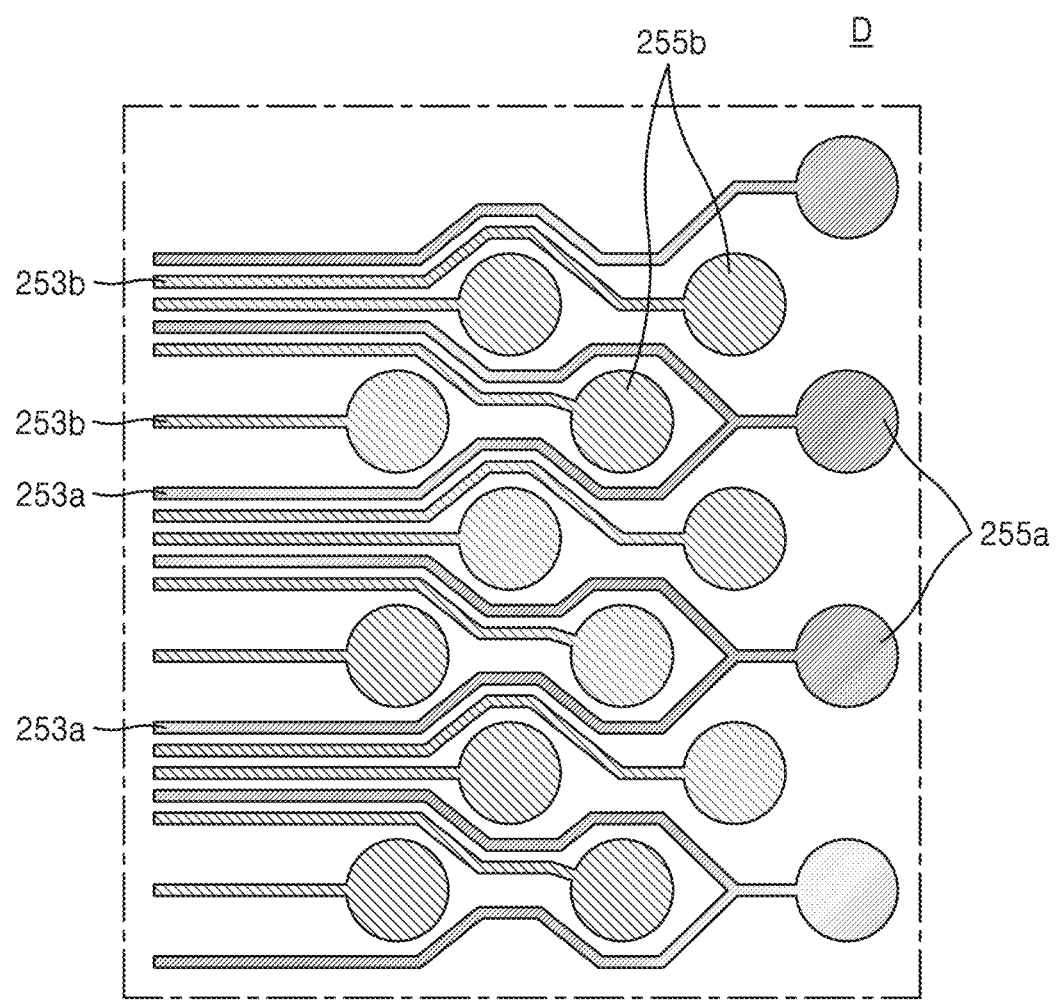
FIG. 7 is a cross-sectional view of a region D of FIG. 6.

FIG. 7 is a cross-sectional view of a region D of FIG. 6.

Referring to FIG. 7, when the semiconductor package 20 is seen from a planar view, the ground via patterns 255a and/or the signal via patterns 255b may be arranged in zigzags or honeycombs.

In some example embodiments, the ground line patterns 253a may be electrically connected to the ground via patterns 255a and the signal line patterns 253b may be electrically connected to the signal via patterns 255b.

In an embodiment, the ground line patterns 253a may be substantially at the same level as that of the signal line patterns 253b. In addition, at least one of the ground line patterns 253a may extend between two adjacent signal line patterns 253b.

In some example embodiments, some of the ground line patterns 253a may surround sides of the signal line patterns 253b. For example, one signal line pattern 253b may extend between two ground line patterns 253a. In addition, two signal line patterns 253b may extend between two ground line patterns 253a.

In some example embodiments, when the signal via patterns 255b are arranged in zigzags, two line patterns may extend between two adjacent signal via patterns 255b. For example, one ground line pattern 253a and one signal line pattern 253b may extend between the two adjacent signal via patterns 255b.

In some example embodiments, when the signal via patterns 255b are arranged in zigzags, one line pattern may extend between two adjacent signal via patterns 255b. For example, one ground line pattern 253a may extend between the two adjacent signal via patterns 255b.

Because the ground line patterns 253a and the signal line patterns 253b of the semiconductor package 20 according to some example embodiments of the inventive concepts may be substantially at the same level and at least one of the ground line patterns 253a may extend among the signal line patterns 253b, signal interference among the signal line patterns 253b may be reduced or prevented. Therefore, the SI of the semiconductor package 20 according to some example embodiments of the inventive concepts may be improved.

Figure 8:
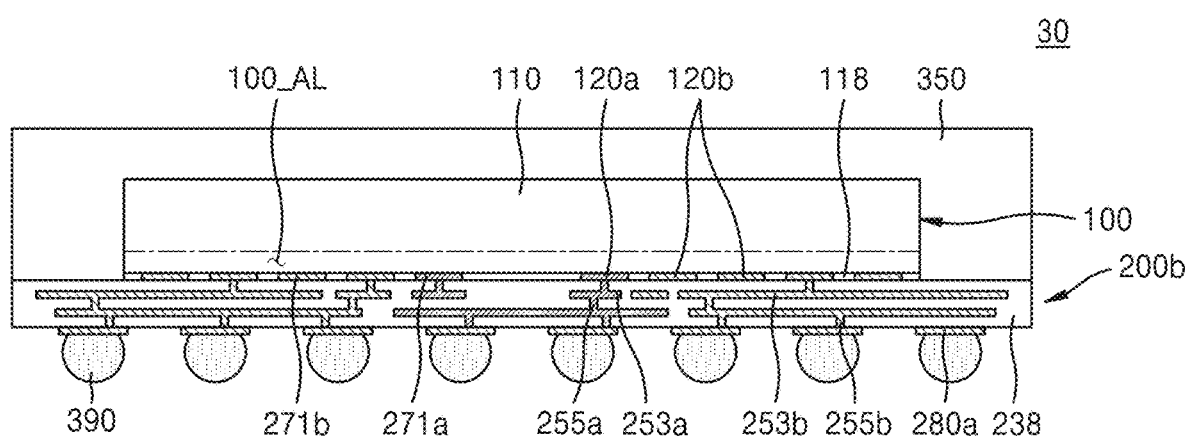
FIG. 8 is a cross-sectional view of a semiconductor package according to some example embodiments of the inventive concepts.

FIG. 8 is a cross-sectional view of a semiconductor package 30 according to some example embodiments of the inventive concepts.

Referring to FIG. 8, the semiconductor package 30 according to some example embodiments of the inventive concepts may include a semiconductor chip 100, a package substrate 200b, and/or a molding layer 350. Hereinafter, description previously given with reference to the semiconductor package 20 of FIG. 6 will not be given with reference to the semiconductor package 30 of FIG. 8 and a difference between the semiconductor package 20 of FIG. 6 and the semiconductor package 30 of FIG. 8 will be mainly described.

The semiconductor chip 100 may include a semiconductor substrate 110 having an active layer 100_AL, ground chip pads 120a arranged on a bottom surface of the semiconductor substrate 110, signal chip pads 120b arranged on the bottom surface of the semiconductor substrate 110, and/or a passivation layer 118 arranged on the semiconductor substrate 110 to surround the ground chip pads 120a and/or the signal chip pads 120b.

The passivation layer 118 may be arranged on the bottom surface of the semiconductor substrate 110 to surround sides of the ground chip pads 120a and/or sides of the signal chip pads 120b and to expose bottom surfaces of the ground chip pads 120a and/or bottom surfaces of the signal chip pads 120b. In some example embodiments, the passivation layer 118 may include at least one of silicon oxynitride (SiON), silicon oxide (SiO$_2$), silicon carbonate nitride (SiOCN), silicon carbonitride (SiCN), and/or a combination of the above materials.

The package substrate 200b may contact the semiconductor chip 100. Specifically, the package substrate 200b may contact the passivation layer 118, the ground chip pads 120a, and/or the signal chip pads 120b of the semiconductor chip 100.

In addition, the package substrate 200b may include a redistribution insulating layer 238, ground line patterns 253a and/or signal line patterns 253b extending in the redistribution insulating layer 238 in the horizontal direction, ground via patterns 255a and/or signal via patterns 255b extending in the redistribution insulating layer 238 in the vertical direction, and/or external connection pads 280a respectively arranged under the redistribution insulating layer 238.

In some example embodiments, the ground via patterns 255a may extend in the redistribution insulating layer 238 in the vertical direction to connect the ground chip pads 120a of the semiconductor chip 100 to the ground line patterns 253a.

In addition, the signal via patterns 255b may extend in the redistribution insulating layer 238 in the vertical direction to connect the signal chip pads 120b of the semiconductor chip 100 to the signal line patterns 253b.

In some example embodiments, the ground line patterns 253a and the signal line patterns 253b may be substantially at the same level in the redistribution insulating layer 238. That is, a height of each or one or more of the ground line patterns 253a from a bottom surface of the package substrate 200b in the vertical direction may be substantially equal to a height of each or one or more of the signal line patterns 253b from the bottom surface of the package substrate 200b in the vertical direction.

In some example embodiments, at least one of the ground line patterns 253a may extend between two adjacent signal line patterns 253b. Therefore, signal interference between the two adjacent signal line patterns 253b may be suppressed so that SI of the semiconductor package 30 may be improved.

Figure 9:
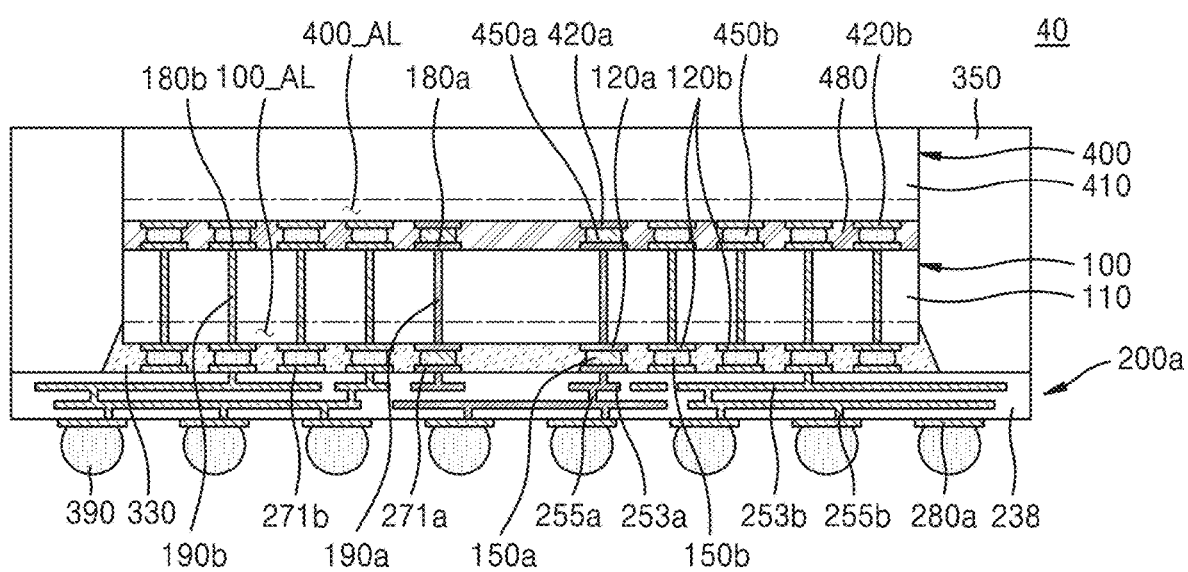
FIG. 9 is a cross-sectional view of a semiconductor package according to some example embodiments of the inventive concepts.

FIG. 9 is a cross-sectional view of a semiconductor package 40 according to some example embodiments of the inventive concepts.

Referring to FIG. 9, the semiconductor package 40 according to some example embodiments of the inventive concepts may include a first semiconductor chip 100, a second semiconductor chip 400, a package substrate 200a, first and/or second ground chip connection terminals 150a and 450a, first and/or second signal chip connection terminals 150b and 450b, an adhesive layer 480, an underfill layer 330, a molding layer 350, and/or external connection terminals 390.

Hereinafter, description previously given with reference to the semiconductor package 20 of FIG. 6 will not be given with reference to the semiconductor package 40 of FIG. 9 and a difference between the semiconductor package 20 of FIG. 6 and the semiconductor package 40 of FIG. 9 will be mainly described.

The first semiconductor chip 100 may include a first semiconductor substrate 110 having a first active layer 100_AL, first lower ground chip pads 120a, first lower signal chip pads 120b, ground through electrodes 190a, signal through electrodes 190b, first upper ground chip pads 180a, and/or first upper signal chip pads 180b.

In some example embodiments, the first lower ground chip pads 120a and/or the first lower signal chip pads 120b may be arranged on a bottom surface of the first semiconductor substrate 110 in zigzags or honeycombs.

The ground through electrodes 190a may pass through at least a part of the first semiconductor substrate 110 in the vertical direction to be connected to the first active layer 100_AL. In addition, the ground through electrodes 190a may be electrically connected to the first lower ground chip pads 120a.

The signal through electrodes 190b may pass through at least a part of the first semiconductor substrate 110 in the vertical direction to be connected to the first active layer 100_AL. In addition, the signal through electrodes 190b may be electrically connected to the first lower signal chip pads 120b.

Each or one or more of the ground through electrodes 190a and the signal through electrodes 190b may include a conductive plug (not shown) and/or a conductive barrier layer (not shown). The conductive plug may pass through at least a part of the first semiconductor substrate 110 in the vertical direction and the conductive barrier layer may surround a side wall of the conductive plug. For example, the conductive plug may be cylindrical and the conductive barrier layer may be cylindrical to surround the side wall of the conductive plug.

The first upper ground chip pads 180a may be arranged on a top surface of the first semiconductor substrate 110 to be electrically connected to the ground through electrodes 190a. In addition, second ground chip connection terminals 450a to be described later may be mounted on the first upper ground chip pads 180a.

The first upper signal chip pads 180b may be arranged on the top surface of the first semiconductor substrate 110 to be electrically connected to the signal through electrodes 190b. In addition, second signal chip connection terminals 450b to be described later may be mounted on the first upper signal chip pads 180b.

The second semiconductor chip 400 may be mounted on the first semiconductor chip 100. In some example embodiments, the first semiconductor chip 100 and the second semiconductor chip 400 may be different kinds of semiconductor chips. Therefore, the semiconductor package 40 may be a system in package (SIP) in which the semiconductor chips 100 and 400 of different kinds are electrically connected to each other to operate as one system. However, the inventive concepts are not limited thereto, and the first semiconductor chip 100 and the second semiconductor chip 400 may be the same kind of semiconductor chips.

In some example embodiments, the second semiconductor chip 400 may include a memory semiconductor chip. However, the inventive concepts are not limited thereto, and the second semiconductor chip 400 may include a logic semiconductor chip.

The second semiconductor chip 400 may include a second semiconductor substrate 410 having a second active layer 400_AL, second lower ground chip pads 420a, and/or second lower signal chip pads 420b.

The second lower ground chip pads 420a may be provided for grounding of the second semiconductor chip 400 and the second signal chip pads 420b may be provided for transmitting a command signal and/or an address signal of the second semiconductor chip 400 and/or a data signal.

The second ground chip connection terminals 450a may be arranged between the first upper ground chip pads 180a of the first semiconductor chip 100 and the second lower ground chip pads 420a of the second semiconductor chip 400 and may electrically connect the first upper ground chip pads 180a to the second lower ground chip pads 420a. Therefore, the second lower ground chip pads 420a of the second semiconductor chip 400 may be electrically connected to the first upper ground chip pads 180a, the ground through electrodes 190a, and/or the first lower ground chip pads 120a of the first semiconductor chip 100.

In addition, the second signal chip connection terminals 450b may be arranged between the first upper signal chip pads 180b of the first semiconductor chip 100 and the second lower signal chip pads 420b of the second semiconductor chip 400 and may electrically connect the first upper signal chip pads 180b to the second lower signal chip pads 420b. Therefore, the second lower signal chip pads 420b of the second semiconductor chip 400 may be electrically connected to the first upper signal chip pads 180b, the signal through electrodes 190b, and/or the first lower signal chip pads 120b of the first semiconductor chip 100.

The adhesive layer 480 may be arranged between the first semiconductor chip 100 and the second semiconductor chip 400 to surround the second ground chip connection terminals 450a and/or the second signal chip connection terminals 450b. In some example embodiments, the adhesive layer 480 may be a die attach film (DAF). However, a kind of the adhesive layer 480 is not limited thereto.

In some example embodiments, the ground line patterns 253a of the package substrate 200a may be electrically connected to the first lower ground chip pads 120a, the ground through electrodes 190a, and/or the first upper ground chip pads 180a of the first semiconductor chip 100 and/or the second lower ground chip pads 420a of the second semiconductor chip 400. In addition, the signal line patterns 253b of the package substrate 200a may be electrically connected to the first lower signal chip pads 120b, the signal through electrodes 190b, and/or the first upper signal chip pads 180b of the first semiconductor chip 100 and/or the second lower signal chip pads 420b of the second semiconductor chip 400.

In some example embodiments, the ground line patterns 253a and the signal line patterns 253b may be substantially at the same level in the redistribution insulating layer 238. That is, a height of each or one or more of the ground line patterns 253a from a bottom surface of the package substrate 200a in the vertical direction may be substantially equal to a height of each or one or more of the signal line patterns 253b from the bottom surface of the package substrate 200a in the vertical direction.

In some example embodiments, at least one of the ground line patterns 253a may extend between two adjacent signal line patterns 253b. Therefore, signal interference between the two adjacent signal line patterns 253b may be suppressed so that SI of the semiconductor package 40 may be improved.

Figure 10:
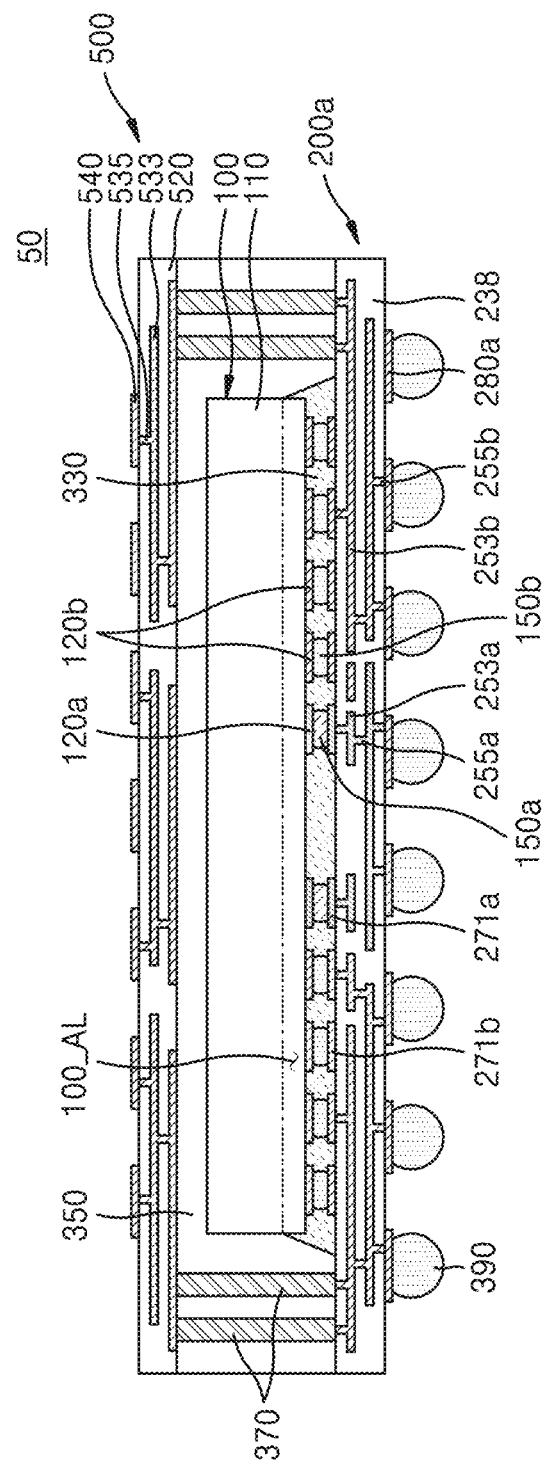
FIG. 10 is a cross-sectional view of a semiconductor package according to some example embodiments of the inventive concepts.

FIG. 10 is a cross-sectional view of a semiconductor package 50 according to some example embodiments of the inventive concepts.

Referring to FIG. 10, the semiconductor package 50 according to some example embodiments of the inventive concepts may include a semiconductor chip 100, ground chip connection terminals 150a, signal chip connection terminals 150b, a package substrate 200a, an underfill layer 330, a molding layer 350, conductive posts 370, external connection terminals 390, and/or an upper redistribution structure 500.

Hereinafter, description previously given with reference to the semiconductor package 20 of FIG. 6 will not be given with reference to the semiconductor package 50 of FIG. 10 and a difference between the semiconductor package 20 of FIG. 6 and the semiconductor package 50 of FIG. 10 will be mainly described.

The semiconductor package 50 according to the inventive concepts may function as a lower semiconductor package in a package-on-package (PoP) type semiconductor package including a lower semiconductor package and an upper semiconductor package. In addition, the semiconductor package 50 according to the inventive concepts may be a wafer level package. Specifically, the semiconductor package 50 may be a fan-out wafer level package.

The conductive posts 370 may be arranged on the package substrate 200a so as to be outside the semiconductor chip 100 and may pass through the molding layer 350 in the vertical direction. In addition, one side of each or one or more of the conductive posts 370 may be connected to the package substrate 200a and the other side of each or one or more of the conductive posts 370 may be connected to the upper redistribution structure 500. In addition, the conductive posts 370 may surround sides of the semiconductor chip 100.

In some example embodiments, the conductive posts 370 may be electrically connected to the signal line patterns 253b and/or the signal via patterns 255b of the package substrate 200a. In addition, the conductive posts 370 may be electrically connected to upper redistribution line patterns 533 and/or upper redistribution via patterns 535 of the upper redistribution structure 500.

In some example embodiments, the conductive posts 370 may include Cu. However, the inventive concepts are not limited thereto, and the conductive posts 370 may include Ni, Au, Ag, Al, W, Ti, Ta, In, Mo, Mn, Co, Sn, Mg, Re, Be, Ga, Ru, and/or an alloy of the above metals.

The upper redistribution structure 500 may include an upper redistribution insulating layer 520, the upper redistribution line patterns 533, the upper redistribution via patterns 535, and/or package connection pads 540.

The upper redistribution insulating layer 520 may be arranged on the molding layer 350 and may surround the upper redistribution line patterns 533 and/or the upper redistribution via patterns 535.

The upper redistribution line patterns 533 may be conductive patterns extending in the upper redistribution insulating layer 520 in the horizontal direction. In addition, the upper redistribution via patterns 535 may extend in the upper redistribution insulating layer 520 in the vertical direction to connect the upper redistribution line patterns 533 to one another and/or to connect the upper redistribution line patterns 533 to the package connection pads 540.

The package connection pads 540 may be mounted on the upper redistribution insulating layer 520. In addition, the package connection pads 540 may be electrically connected to the upper redistribution line patterns 533 and/or the upper redistribution via patterns 535. In addition, a semiconductor package 90 (refer to FIG. 11) functioning as an upper semiconductor package may be mounted on the package connection pads 540.

In some example embodiments, the ground line patterns 253a and the signal line patterns 253b of the package substrate 200a may be substantially at the same level in the redistribution insulating layer 238. That is, a height of each or one or more of the ground line patterns 253a from a bottom surface of the package substrate 200a in the vertical direction may be substantially equal to a height of each or one or more of the signal line patterns 253b from the bottom surface of the package substrate 200a in the vertical direction.

In some example embodiments, at least one of the ground line patterns 253a may extend between two adjacent signal line patterns 253b. Therefore, signal interference between the two adjacent signal line patterns 253b may be suppressed so that SI of the semiconductor package 50 may be improved.

Figure 11:
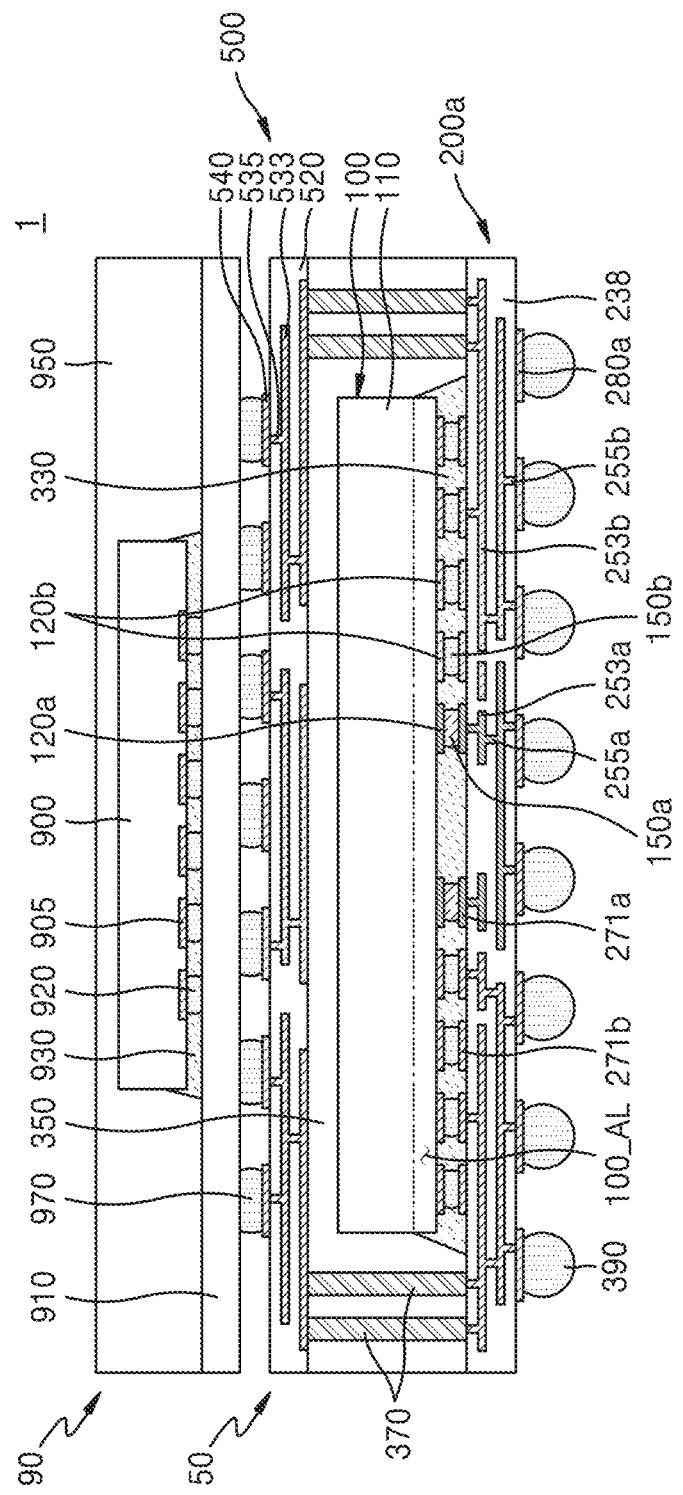
FIG. 11 is a cross-sectional view of a semiconductor package according to some example embodiments of the inventive concepts.

FIG. 11 is a cross-sectional view of a semiconductor package 1 according to some example embodiments of the inventive concepts.

Referring to FIG. 11, the semiconductor package 1 according to the inventive concepts may be a PoP type semiconductor package in which a semiconductor package 90 is mounted on the semiconductor package 50.

The semiconductor package 50 may include the semiconductor chip 100, the ground chip connection terminals 150a, the signal chip connection terminals 150b, the package substrate 200a, the underfill layer 330, the molding layer 350, the conductive posts 370, the external connection terminals 390, and/or the upper redistribution structure 500. Description previously given with reference to the semiconductor package 50 of FIG. 10 will not be given.

The semiconductor package 90 may include a semiconductor chip 900, chip connection terminals 920, a package substrate 910, an underfill layer 930, a molding layer 950, and/or package connection terminals 970.

The semiconductor chip 900 may be different from the semiconductor chip 100. Therefore, the semiconductor package 1 may be an SIP in which the semiconductor chips 100 and 900 of different kinds are electrically connected to each other to operate as one system.

The package substrate 910 may support the semiconductor chip 900. In addition, the chip connection terminals 920 may be arranged between the package substrate 910 and chip pads 905 of the semiconductor chip 900 to electrically connect a plurality of individual elements in an active layer of the semiconductor chip 900 to a substrate pattern (not shown) in the package substrate 910.

The underfill layer 930 may be arranged between the semiconductor chip 900 and the package substrate 910 to fix the semiconductor chip 900 onto the package substrate 910. In addition, the molding layer 950 may be arranged on the package substrate 910 to surround the semiconductor chip 900.

The package connection terminals 970 may be arranged between the package substrate 910 of the semiconductor package 90 and the package connecting pads 540 of the upper redistribution structure 500 of the semiconductor package 50.

Figure 12:
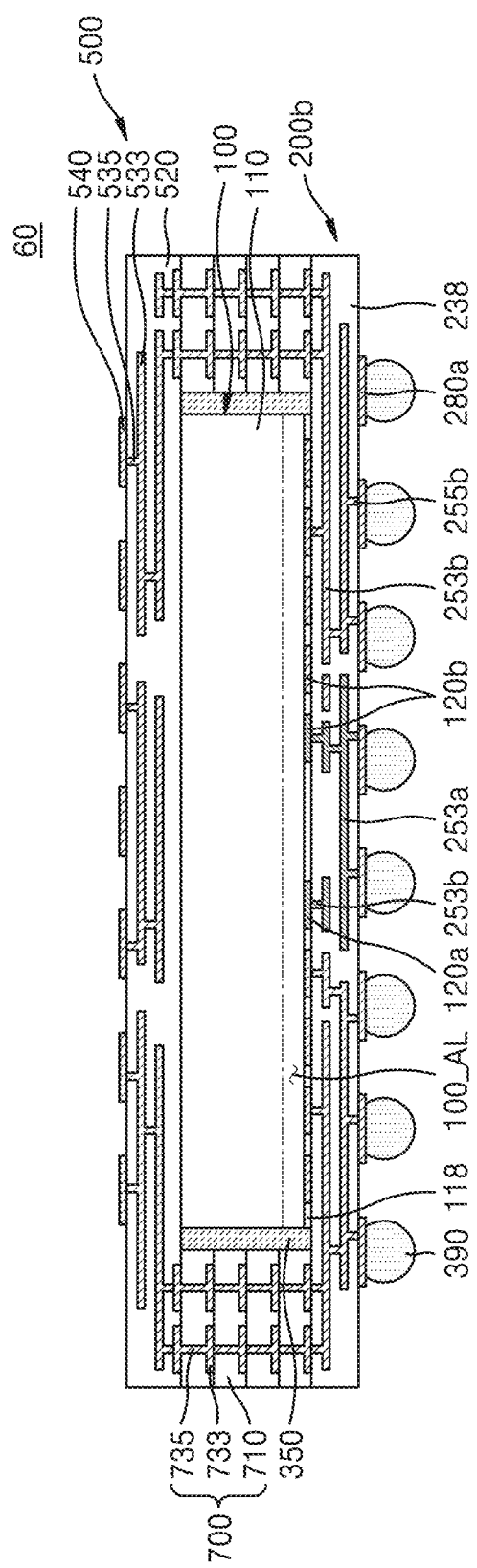
FIG. 12 is a cross-sectional view of a semiconductor package according to some example embodiments of the inventive concepts.

FIG. 12 is a cross-sectional view of a semiconductor package 60 according to some example embodiments of the inventive concepts.

Referring to FIG. 12, the semiconductor package 60 according to the inventive concepts may include a semiconductor chip 100, a package substrate 200b, an extended layer 700, a molding layer 350, and/or an upper redistribution structure 500.

Hereinafter, description previously given with reference to the semiconductor package 30 of FIG. 8 will not be given with reference to the semiconductor package 60 of FIG. 12 and a difference between the semiconductor package 30 of FIG. 8 and the semiconductor package 60 of FIG. 12 will be mainly described.

The semiconductor package 60 according to the inventive concepts may function as a lower semiconductor package in a PoP type semiconductor package including a lower semiconductor package and an upper semiconductor package. In addition, the semiconductor package 60 according to the inventive concepts may be a panel level package. Specifically, the semiconductor package 60 may be a fan-out panel level package.

The extended layer 700 may be arranged on the package substrate 200b. In addition, the extended layer 700 may include a PCB, a ceramic substrate, a package manufacturing wafer, and/or an interposer. The extended layer 700 may include substrate bases 710, substrate line patterns 733, and/or substrate via patterns 735.

In some example embodiments, the extended layer 700 may surround sides of the semiconductor chip 100. In addition, an internal surface of the extended layer 700 may be apart from the sides of the semiconductor chip 100 in the horizontal direction. The molding layer 350 may be arranged in a space between the extended layer 700 and the semiconductor chip 100.

The substrate bases 710 may include a plurality of substrate base layers stacked in the vertical direction. The substrate bases 710 may include at least one selected from phenolic resin, epoxy resin, and/or PI. For example, the substrate bases 710 may include at least one selected from FR4, tetrafunctional epoxy, polyphenylene ether, epoxy/polyphenylene oxide, BT, thermount, cyanate ester, PI, and/or liquid crystal polymer.

The substrate line patterns 733 may be arranged on top and bottom surfaces of the substrate bases 710. In addition, the substrate via patterns 735 may pass through the substrate bases 710 in the vertical direction to connect the substrate line patterns 733 to one another.

The upper redistribution structure 500 may include an upper redistribution insulating layer 520, upper redistribution line patterns 533, upper redistribution via patterns 535, and/or package connection pads 540.

In an embodiment, the upper redistribution line patterns 533 and/or the upper redistribution via patterns 535 may be electrically connected to the substrate line patterns 733 and/or the substrate via patterns 735 of the extended layer 700. In addition, signal line patterns 253b and/or signal via patterns 255b of the package substrate 200b may be electrically connected to the substrate line patterns 733 and/or the substrate via patterns 735 of the extended layer 700.

Figure 13:
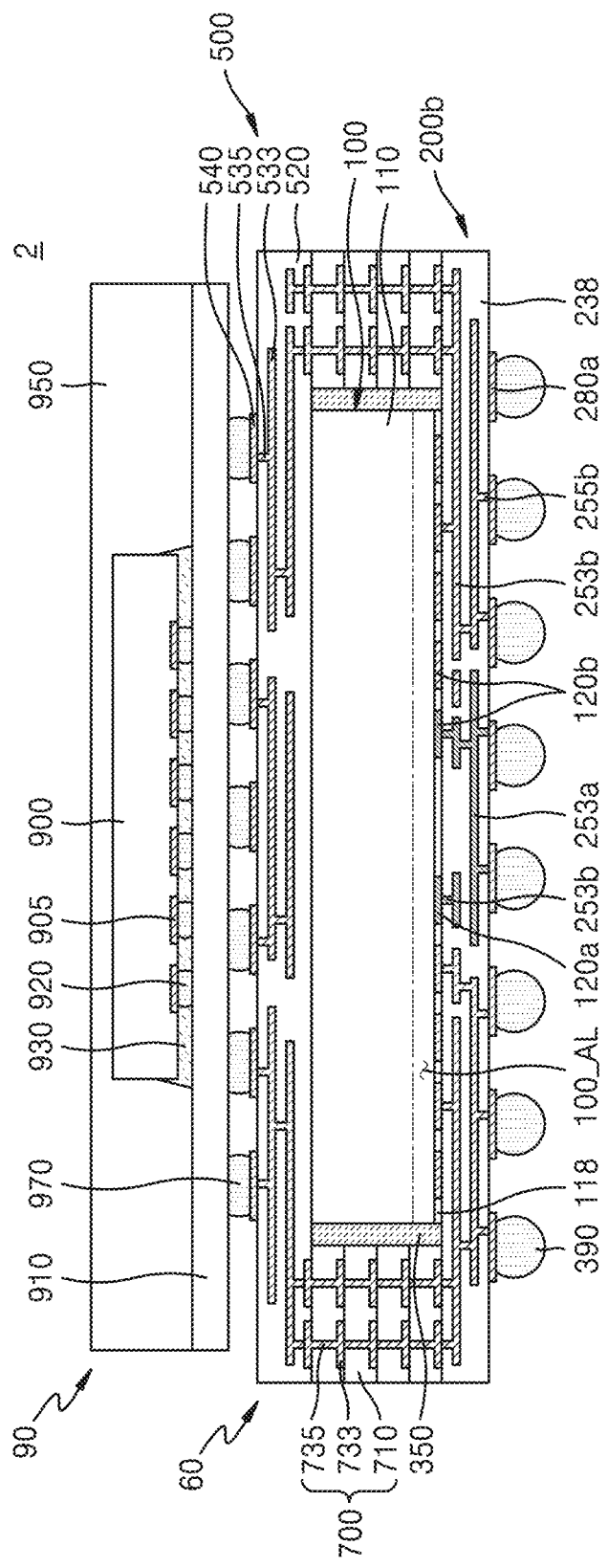
FIG. 13 is a cross-sectional view of a semiconductor package according to some example embodiments of the inventive concepts.

FIG. 13 is a cross-sectional view of a semiconductor package 2 according to some example embodiments of the inventive concepts.

Referring to FIG. 13, the semiconductor package 2 according to the inventive concepts may be a PoP type semiconductor package in which the semiconductor package 90 is mounted on the semiconductor package 60.

The semiconductor package 60 may include a semiconductor chip 100, a package substrate 200b, an extended layer 700, a molding layer 350, and/or an upper redistribution structure 500. Description previously given with reference to the semiconductor package 60 of FIG. 12 will not be given.

The semiconductor package 90 may include a semiconductor chip 900, chip connection terminals 920, a package substrate 910, an underfill layer 930, a molding layer 950, and/or package connection terminals 970. Description previously given with reference to the semiconductor package 90 of FIG. 11 will not be given.

FIGS. 14 to 17 are views illustrating processes of a method of manufacturing a semiconductor package according to some example embodiments of the inventive concepts. Specifically, a method of manufacturing a semiconductor package according to the inventive concepts may be the method of manufacturing the semiconductor package 20 of FIG. 6.

Figure 14:
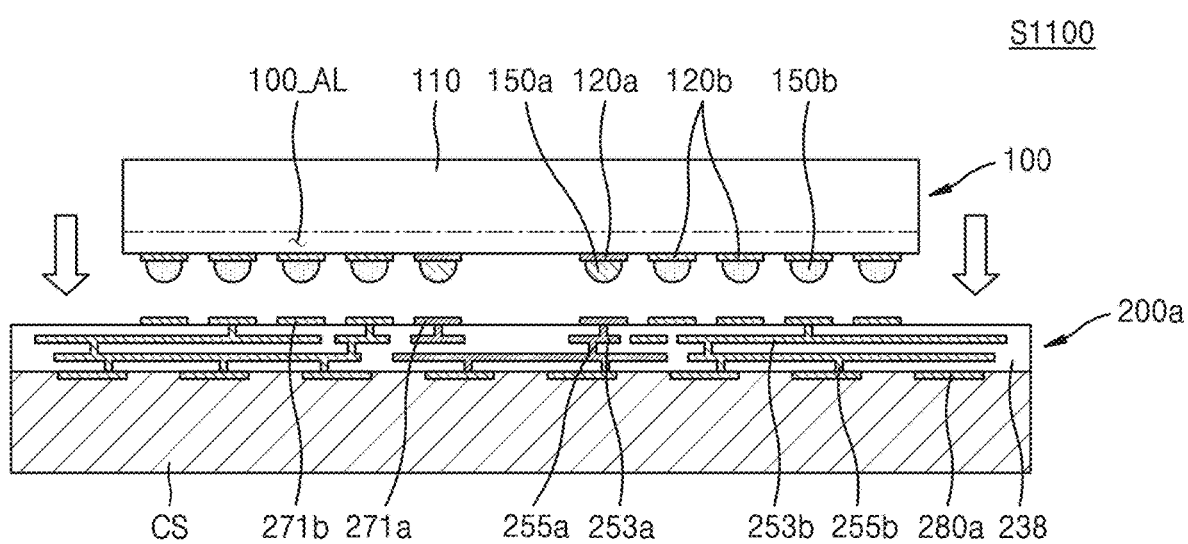
FIGS. 14 to 17 are views illustrating processes of a method of manufacturing a semiconductor package according to some example embodiments of the inventive concepts.

Referring to FIG. 14, the method of manufacturing the semiconductor package according to the inventive concepts may include operation S1100 of mounting the semiconductor chip 100 on the package substrate 200a.

Before performing operation S1100, a carrier substrate CS may be attached under the package substrate 200a. In some example embodiments, the carrier substrate CS may include any material having stability to various manufacturing processes of the semiconductor package.

When the carrier substrate CS is to be separated and removed by laser ablation, the carrier substrate CS may be a light-transmissive substrate. Optionally, when the carrier substrate CS is to be separated and removed by heating, the carrier substrate CS may be a heat-resistant substrate.

In some example embodiments, the carrier substrate CS may be a glass substrate. Alternatively, in some example embodiments, the carrier substrate CS may include a heat-resistant organic polymeric material such as PI, polyetheretherketone (PEEK), polyethersulfulfone (PES), and/or polyphenylene sulfide (PPS). However, the inventive concepts are not limited thereto.

In operation S1100, the semiconductor chip 100 may be mounted on the package substrate 200a through a flip chip bonding process. In some example embodiments, in operation S1100, the ground chip connection terminals 150a attached to the ground chip pads 120a of the semiconductor chip 100 may contact the ground substrate pads 271a of the package substrate 200a. In operation S1100, the signal chip connection terminals 150b attached to the signal chip pads 120b of the semiconductor chip 100 may contact the signal substrate pads 271b of the package substrate 200a.

Figure 15:
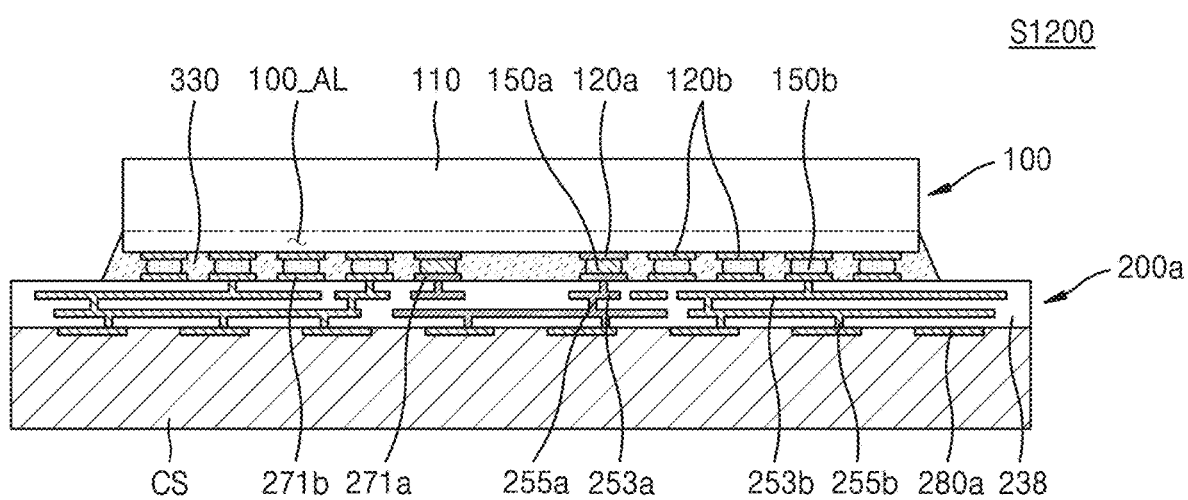

Referring to FIG. 15, the method of manufacturing the semiconductor package according to the inventive concepts may include operation S1200 of forming the underfill layer 330 between the package substrate 200a and the semiconductor chip 100.

In operation S1200, an underfill material may be implanted into a space between the package substrate 200a and the semiconductor chip 100. The underfill layer 330 arranged between the package substrate 200a and the semiconductor chip 100 may fix the semiconductor chip 100 onto the package substrate 200a. In addition, the underfill layer 330 may surround sides of the ground chip connection terminals 150a and/or the signal chip connection terminals 150b.

Figure 16:
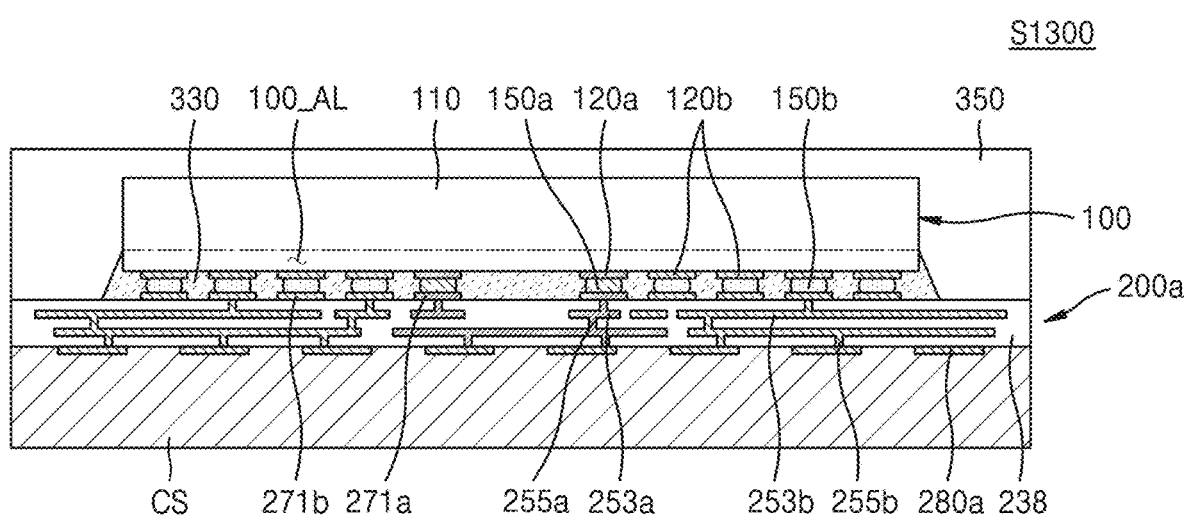

Referring to FIG. 16, the method of manufacturing the semiconductor package according to the inventive concepts may include operation S1300 of forming the molding layer 350 on the package substrate 200a.

In operation S1300, the molding layer 350 may surround the sides and/or a top surface of the semiconductor chip 100 on the package substrate 200a. However, the inventive concepts are not limited thereto. The molding layer 350 may surround only the sides of the semiconductor chip 100 and the top surface of the semiconductor chip 100 may be exposed to the outside.

Figure 17:
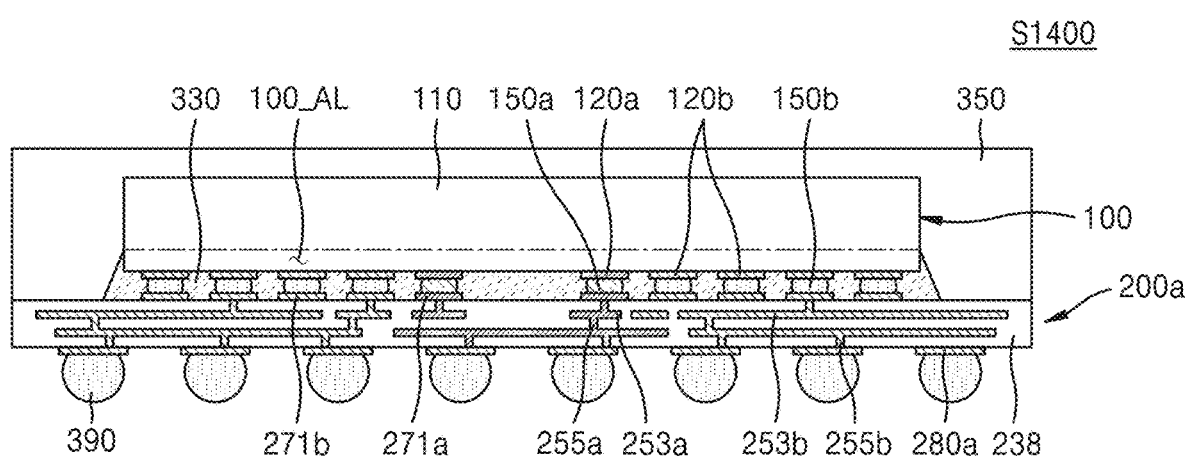

Referring to FIG. 17, the method of manufacturing the semiconductor package according to the inventive concepts may include operation S1400 of forming the external connection terminals 390 on the package substrate 200a.

Before performing operation S1400, the carrier substrate CS may be removed. For example, the carrier substrate CS may be separated from the package substrate 200a by laser ablation or heating.

In operation S1400, the external connection terminals 390 may be electrically connected to the external connection pads 280a arranged under the redistribution insulating layer 238.

While the inventive concepts have been particularly shown and described with reference to some example embodiments thereof, it will be understood that various changes in form and details may be made therein without departing from the spirit and scope of the following claims.

What is claimed is:

1. A semiconductor package comprising:
   a semiconductor chip including
      a semiconductor substrate having an active layer,
      ground chip pads on the semiconductor substrate, and
      signal chip pads on the semiconductor substrate; and
   a package substrate supporting the semiconductor chip, the package substrate including
      a substrate insulating layer comprising a plurality of layers,
      a plurality of signal line patterns extending in the substrate insulating layer and electrically connected to the signal chip pads,
      a plurality of ground line patterns extending in the substrate insulating layer and electrically connected to the ground chip pads,
      a plurality of signal substrate pads contacting a plurality of signal chip connection terminals and electrically connected to the signal line patterns, and
      a plurality of ground substrate pads contacting a plurality of ground chip connection terminals and electrically connected to the plurality of ground line patterns,
   wherein the plurality of signal line patterns and the plurality of ground line patterns are arranged in at least a first layer of the plurality of layers,
   wherein the plurality of signal substrate pads and the plurality of ground substrate pads are arranged in the first layer of the plurality of layers and also are arranged in a plurality of columns, wherein each column of the plurality of columns is laterally offset from an adjacent column, and wherein a first column closest to a center region of the semiconductor substrate comprises the plurality of ground substrate pads, and
   wherein at least one ground line pattern of the plurality of ground line patterns extends between the plurality of signal line patterns.

2. The semiconductor package of claim 1,
   wherein the ground chip pads are in the center region of the semiconductor substrate, and
   wherein the signal chip pads are at edges of the semiconductor substrate so as to be outside the ground chip pads.

3. The semiconductor package of claim 1, further comprising:
   signal chip connection terminals between the semiconductor chip and the package substrate electrically connecting the signal chip pads to the signal line patterns; and
   ground chip connection terminals between the semiconductor chip and the package substrate electrically connecting the ground chip pads to the ground line patterns.

4. The semiconductor package of claim 1, wherein, a pitch between a first signal substrate pad and a second signal substrate pad that is adjacent to the first signal substrate pad is 125 micrometers to 148 micrometers at a location where one ground line pattern of the plurality of ground line patterns extends between the first signal substrate pad and the second signal substrate pad.

5. The semiconductor package of claim 1, wherein, a pitch between a first signal substrate pad and a second signal substrate pad that is adjacent to the first signal substrate pad is 146 micrometers to 158 micrometers at a location where one ground line pattern of the plurality of ground line patterns and one signal line pattern of the plurality of signal line patterns extend between the first signal substrate pad and the second signal substrate pad.

6. The semiconductor package of claim 1, wherein the package substrate further comprises:
   signal via patterns extending in the substrate insulating layer in a vertical direction and electrically connecting the plurality of signal line patterns to one another; and
   ground via patterns extending in the substrate insulating layer in the vertical direction and electrically connecting the plurality of ground line patterns to one another.

7. The semiconductor package of claim 1, wherein, when the semiconductor substrate is seen from a plan view, a width of each of the ground line patterns and the signal line patterns is 5 micrometers to 20 micrometers.

8. The semiconductor package of claim 1, wherein each ground line pattern of the plurality of ground line patterns is between 10 micrometers to 100 micrometers away along a horizontal direction from an adjacent signal line pattern of the plurality of signal line patterns.

9. The semiconductor package of claim 1, wherein a width of each of the ground line patterns and the signal line patterns is 3 micrometers to 30 micrometers.

10. The semiconductor package of claim 1, wherein the ground line patterns and the signal line patterns include copper (Cu).

11. The semiconductor package of claim 3, further comprising:
    an underfill layer between the semiconductor chip and the package substrate surrounding the signal chip connection terminals and the ground chip connection terminals; and
    a molding layer surrounding the semiconductor chip on the package substrate.

12. The semiconductor package of claim 11, further comprising:
    conductive posts outside the semiconductor chip, passing through the molding layer in a vertical direction and electrically connected to the signal line patterns; and
    an upper redistribution structure on the molding layer, the upper redistribution structure including
       an upper redistribution insulating layer on the molding layer,
       upper redistribution line patterns extending in the upper redistribution insulating layer in a horizontal direction and electrically connected to the conductive posts, and
       upper redistribution via patterns extending in the upper redistribution insulating layer in the vertical direction and electrically connected to the upper redistribution line patterns.

13. A semiconductor package comprising:
    a first semiconductor chip including
       a first semiconductor substrate having a first active layer,
       first lower ground chip pads under the first semiconductor substrate,
       first lower signal chip pads under the first semiconductor substrate,
       ground through electrodes passing through at least a part of the first semiconductor substrate in a vertical direction and electrically connected to the first lower ground chip pads,
       signal through electrodes passing through at least a part of the first semiconductor substrate in the vertical direction and electrically connected to the first lower signal chip pads, first upper ground chip pads on the first semiconductor substrate and electrically connected to the ground through electrodes, and first upper signal chip pads on the first semiconductor substrate and electrically connected to the signal through electrodes;

a second semiconductor chip on the first semiconductor chip, the second semiconductor chip including a second semiconductor substrate having a second active layer, second lower ground chip pads under the second semiconductor substrate, and second lower signal chip pads under the second semiconductor substrate;

ground chip connection terminals between the first upper ground chip pads and the second lower ground chip pads;

signal chip connection terminals between the first upper signal chip pads and the second lower signal chip pads; and a package substrate supporting the first semiconductor chip, the package substrate including a substrate insulating layer comprising a plurality of layers, a plurality of signal line patterns extending in the substrate insulating layer and electrically connected to the first lower signal chip pads, a plurality of ground line patterns extending in the substrate insulating layer and electrically connected to the first lower ground chip pads, a plurality of signal substrate pads contacting a plurality of signal chip connection terminals and electrically connected to the signal line patterns, and a plurality of ground substrate pads contacting a plurality of ground chip connection terminals and electrically connected to the ground line patterns, wherein the plurality of signal line patterns and the plurality of ground line patterns are arranged in at least a first layer of the plurality of layers, wherein the plurality of signal substrate pads and the plurality of ground substrate pads are arranged in the first layer of the plurality of layers and are arranged in a plurality of columns, wherein each column of the plurality of columns is laterally offset from an adjacent column, and wherein a first column closest to a center region of the first semiconductor substrate comprises the plurality of ground substrate pads, and wherein at least one ground line pattern of the plurality of ground line patterns extends between the plurality of signal line patterns.

14. The semiconductor package of claim 13, wherein the first lower ground chip pads, the first upper ground chip pads, and the ground through electrodes are in the center region of the first semiconductor substrate, wherein the first lower signal chip pads, the first upper signal chip pads, and the signal through electrodes are at edges of the first semiconductor substrate, wherein the second lower ground chip pads are in the center region of the second semiconductor substrate overlapping the first upper ground chip pads in the vertical direction, and wherein the second lower signal chip pads are at edges of the second semiconductor substrate overlapping the first upper signal chip pads in the vertical direction.

15. The semiconductor package of claim 13, further comprising:

an adhesive layer between the first semiconductor chip and the second semiconductor chip and surrounding the ground chip connection terminals and the signal chip connection terminals.

16. The semiconductor package of claim 13, wherein, when the first semiconductor substrate is seen from a plan view, a width of each of the ground line patterns and the signal line patterns is 5 micrometers to 20 micrometers.

17. The semiconductor package of claim 13, wherein each ground line pattern of the plurality of ground line patterns is 10 micrometers to 100 micrometers away along a horizontal direction from an adjacent signal line pattern of the plurality of signal line patterns.

18. The semiconductor package of claim 13, wherein a width of each of the ground line patterns and the signal line patterns is 3 micrometers to 30 micrometers.

19. A semiconductor package comprising:

a lower semiconductor chip including a semiconductor substrate having an active layer, ground chip pads on the semiconductor substrate, and signal chip pads on the semiconductor substrate;

a lower package substrate supporting the lower semiconductor chip, the lower package substrate including a substrate insulating layer comprising a plurality of layers, a plurality of signal line patterns extending in the substrate insulating layer and electrically connected to the signal chip pads, a plurality of ground line patterns extending in the substrate insulating layer and electrically connected to the ground chip pads, a plurality of signal substrate pads contacting a plurality of signal chip connection terminals and electrically connected to the signal line patterns, and a plurality of ground substrate pads contacting a plurality of ground chip connection terminals and electrically connected to the ground line patterns, wherein the plurality of signal line patterns and the plurality of ground line patterns are arranged in at least a first layer of the plurality of layers, and wherein the plurality of signal substrate pads and the plurality of ground substrate pads are arranged in the first layer of the plurality of layers and are arranged in a plurality of columns, wherein each column of the plurality of columns is laterally offset from an adjacent column, and wherein a first column closest to a center region of the semiconductor substrate comprises the plurality of ground substrate pads;

conductive posts outside the lower semiconductor chip and electrically connected to the signal line patterns;

a lower molding layer surrounding the lower semiconductor chip and the conductive posts on the lower package substrate; and an upper redistribution structure on the lower molding layer, the upper redistribution structure including an upper redistribution insulating layer on the lower molding layer, and upper redistribution line patterns extending in the upper redistribution insulating layer and electrically connected to the conductive posts, wherein at least one ground line pattern of the plurality of ground line patterns extends between the plurality of signal line patterns.

* * * * *